(12) United States Patent
Kobayashi (10) Patent No.: US 7,663,732 B2
(45) Date of Patent: Feb. 16, 2010

(54) EXPOSURE APPARATUS, EXPOSURE METHOD AND DEVICE MANUFACTURING METHOD FOR COMPENSATING POSITION MEASURING SYSTEM USING TEMPERATURE

(75) Inventor: Takenobu Kobayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 523 days.

(21) Appl. No.: 11/378,769

(22) Filed: Mar. 17, 2006

(65) Prior Publication Data

US 2006/0209284 A1    Sep. 21, 2006

(30) Foreign Application Priority Data

Mar. 18, 2005    (JP) ............................. 2005-079498

(51) Int. Cl.
*G03B 27/52* (2006.01)
*G03B 27/62* (2006.01)
(52) U.S. Cl. .......................................... 355/30; 355/75
(58) Field of Classification Search .................. 355/30, 355/75, 53
See application file for complete search history.

(56) References Cited

U.S. PATENT DOCUMENTS 5,940,528 A * 8/1999 Tanaka et al. ............... 382/151

6,645,701 B1 * 11/2003 Ota et al. ..................... 430/311

FOREIGN PATENT DOCUMENTS

JP    2003-264136    9/2003

* cited by examiner

*Primary Examiner*—Peter B Kim
*Assistant Examiner*—Chia-how Michael Liu
(74) *Attorney, Agent, or Firm*—Cowan, Liebowitz & Latman, P.C.

(57) ABSTRACT

An exposure apparatus, and exposure method and a device manufacturing method, wherein the exposure apparatus includes a projection optical system, an original stage configured to hold an original thereon and to move the original, a position measuring system configured to measure a position of a pattern surface of the original held by the original stage, with respect to a direction parallel to an optical axis of the projection optical system, an exposure system configured to expose a substrate through the original and the projection optical system, on the basis of the measurement by the position measuring system, a memory configured to store therein compensation information that interrelates a temperature of the position measuring system and a compensation quantity for compensating for an output of the position measuring system, and a controller configured to compensate for an output of the position measuring system on the basis of the compensation information stored in the memory, to obtain a position measured value for the pattern surface.

6 Claims, 8 Drawing Sheets

# EXPOSURE APPARATUS, EXPOSURE METHOD AND DEVICE MANUFACTURING METHOD FOR COMPENSATING POSITION MEASURING SYSTEM USING TEMPERATURE

FIELD OF THE INVENTION AND RELATED ART

This invention relates to an exposure apparatus, an exposure method and a device manufacturing method, suitably usable in manufacture of devices such as semiconductor devices, for example.

Simultaneous exposure type projection exposure apparatuses such as a stepper are used in the manufacture of semiconductor devices or the like, but in addition to this, scan exposure type projection exposure apparatuses such as step-and-scan exposure apparatuses (scanning exposure apparatuses) are also used therein.

In projection optical systems of such exposure apparatuses, a resolving power close to the limit is required. Hence, a mechanism is usually provided to measure factors that are influential to the resolving power such as atmosphere and environment temperature, for example, and to compensate the imaging characteristics on the basis of the results of measurement.

Furthermore, for an enhanced resolving power, a larger numerical aperture of the projection optical system is set and, as a result of this, the depth of focus is smaller. An autofocusing mechanism is provided there in consideration of this, by which the position of irregular surface of a wafer with respect to the optical axis direction of the projection optical system is measured (i.e., wafer pattern surface measurement) through an oblique incidence type surface position measuring system, and by which, on the basis of the result of measurement, the wafer surface is brought into registration with an image plane of the projection optical system during the exposure process.

Conventionally, irregular surface measurement for a reticle pattern surface with respect to the optical axis direction of a projection optical system is not regarded so much important as compared with the irregular surface measurement for a wafer surface. This is because any deviation of the reticle pattern surface with respect to the optical axis direction of the projection optical system can cause a deviation on the image plane of an amount of only $1/m^2$ where m is the magnification of the projection optical system. For example, if a projection optical system has a magnification of 4×, a deviation of 50 nm at the reticle pattern surface with respect to the optical axis direction of the projection optical system will cause a deviation at the image plane of an amount of about 3 nm.

In recent years, however, an imaging magnification due to deformation of a reticle cannot be disregarded. Namely, if, for example, the pattern surface of a reticle is warped approximately uniformly toward a projection optical system, an average position of the image plane thereof would be lowered and, therefore, a defocus would be caused easily.

Furthermore, if the pattern surface of the reticle is deformed, the position of a pattern on that surface with respect to a direction perpendicular to the optical axis of the projection optical system may change. Such lateral deviation of the pattern would be a factor of distortion.

Reticle deformation may be categorized in accordance with causes, into (a) deformation by the self-weight, (b) flatness of the reticle pattern surface, and (c) deformation due to the flatness at the contact surface when a reticle is held by attraction upon a reticle holder (including nipping of particles).

The amount of deformation to be caused by these can not be disregarded. On the other hand, since the reticle deformation such as described above is different with reticles, more particularly, with respective reticle holders of exposure apparatuses. Hence, in order to measure the reticle deformation amount exactly, is it necessary to carry out the measurement while a reticle is actually loaded and held by attraction upon a reticle holder of a projection optical system, as disclosed in Japanese Laid-Open Patent Application, Publication No. 2003-264136. In the structure proposed there, a similar detection system like an oblique incidence type focal point position detecting system for measuring a pattern surface of a wafer is provided in relation to a reticle stage as well.

The reticle pattern surface measurement as well as calculation of a compensating quantity may be carried out as follows.

A reticle which functions as a reference is prepared beforehand and, while setting a reticle stage and a wafer stage into a state similar to that during an exposure operation, measurement is carried out to the reticle pattern surface at a plurality of measurement points. From the quantities obtained by these measurements, an approximate surface for the reticle pattern surface is calculated. Subsequently, the position of an image plane of a projection optical system is detected, and this image plane position is then stored in association with the approximate surface of the reticle pattern surface. In an actual exposure process, measurement is carried out with regard to a plurality of measurement points upon a reticle pattern surface of a reticle which an operator is going to use, and, from the results of measurements, an approximate surface of the reticle pattern surface is calculated. The thus obtained approximate surface is compared with the aforementioned approximate surface of the reference reticle pattern having been calculated beforehand, and any deviation between them is detected. This deviation is then converted into a deviation amount in respect to the position on the image plane of the projection optical system.

Compensation for this deviation amount may be made as follows. With regard to a scan direction, it can be done on the basis of wafer stage drive, and with regard to a non-scan direction on the other hand, it can be done by moving a projection lens. Exposure at a best focus position is assured thereby.

In the reticle pattern surface measurement, the measurement is carried out while scanningly moving the reticle stage in the scan direction and at a speed corresponding to that for an actual exposure operation.

Here, the reticle stage is driven by linear motors and guides used there are made of a ferromagnetic material such as iron, for example. Because of this, an eddy current would be produced in the guide in response to movement of magnets that constitute a preloading unit of an air slide (static bearing unit). Such eddy current would cause heat generation of an amount that could not be disregarded.

Heat generation from a stage driving unit resulting from continuous reticle stage scan motion such as described above, or heat generation from a reticle having a temperature raised by illumination with light, may cause a change in temperature of an oblique incident type provided to measure the reticle pattern surface, which in turn may cause a measurement error. For example, the measurement error for the reticle pattern surface to be caused by heat will be, although it depends on the mechanical structure or the like of a used detection system, 10 nm per 0.1° C. In consideration of this, the approximate surface of the reticle pattern surface obtained by calculation based on measurements to the reference reticle pattern surface as described above is memorized in relation to each scan speed.

The reticle pattern surface measurement may be carried out at the timing as the exposure condition (e.g., scan speed) is changed or the reticle is replaced, for example. However, the reticle replacement timing, for example, may differ with lots to be exposed. More specifically, between a case where only a few wafers are to be exposed for small amount production and a case where many wafers are to be exposed successively for large amount production, the temperature of an oblique incidence type surface position measuring system (which hereinafter will be referred to also as "surface position measuring means" or simply as "position measuring system" or "position measuring means") or the temperature of a reticle may differ, although it may depend on the condition for measurement to the reticle pattern surface. Such temperature difference may cause an error in the measured quantity of the reticle pattern surface.

SUMMARY OF THE INVENTION

It is accordingly an object of the present invention to reduce a measurement error due to a temperature change in a position measuring system.

In accordance with an aspect of the present invention, there is provided an exposure apparatus, comprising:

a projection optical system;

an original stage configured to hold an original thereon and to move the original;

a position measuring system configured to measure a position of a pattern surface of the original held by said original stage, with respect to a direction parallel to an optical axis of said projection optical system, so that a substrate can be exposed through the original and said projection optical system, on the basis of the measurement by said position measuring system;

a memory configured to store therein compensation information that interrelates a temperature of said position measuring system and a compensation quantity for compensating for an output of said position measuring system; and a controller configured to compensate for an output of said position measuring system on the basis of the compensation information stored in said memory, to obtain a position measured value for the pattern surface.

In accordance with another aspect of the present invention, there is provided an exposure method for exposing a substrate through an original and a projection optical system, said method comprising steps of:

measuring by use of a position measuring system a position of a patter surface of the original, as held by an original stage configured to hold and to move the original, with respect to a direction parallel to an optical axis of the projection optical system;

compensating for a position measured value for the pattern surface as being outputted from the position measuring system, on the basis of compensation information that interrelates a temperature of the position measuring system and a compensation quantity for compensating for an output of the position measuring system; and exposing the substrate through the original and the projection optical system, on the basis of the position measured value as compensated.

In accordance with a further aspect of the present invention, there is provided a device manufacturing method, comprising steps of:

exposing a substrate to light through a reticle, by use of an exposure apparatus as recited above;

developing the exposed substrate; and processing the developed substrate to produce a device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
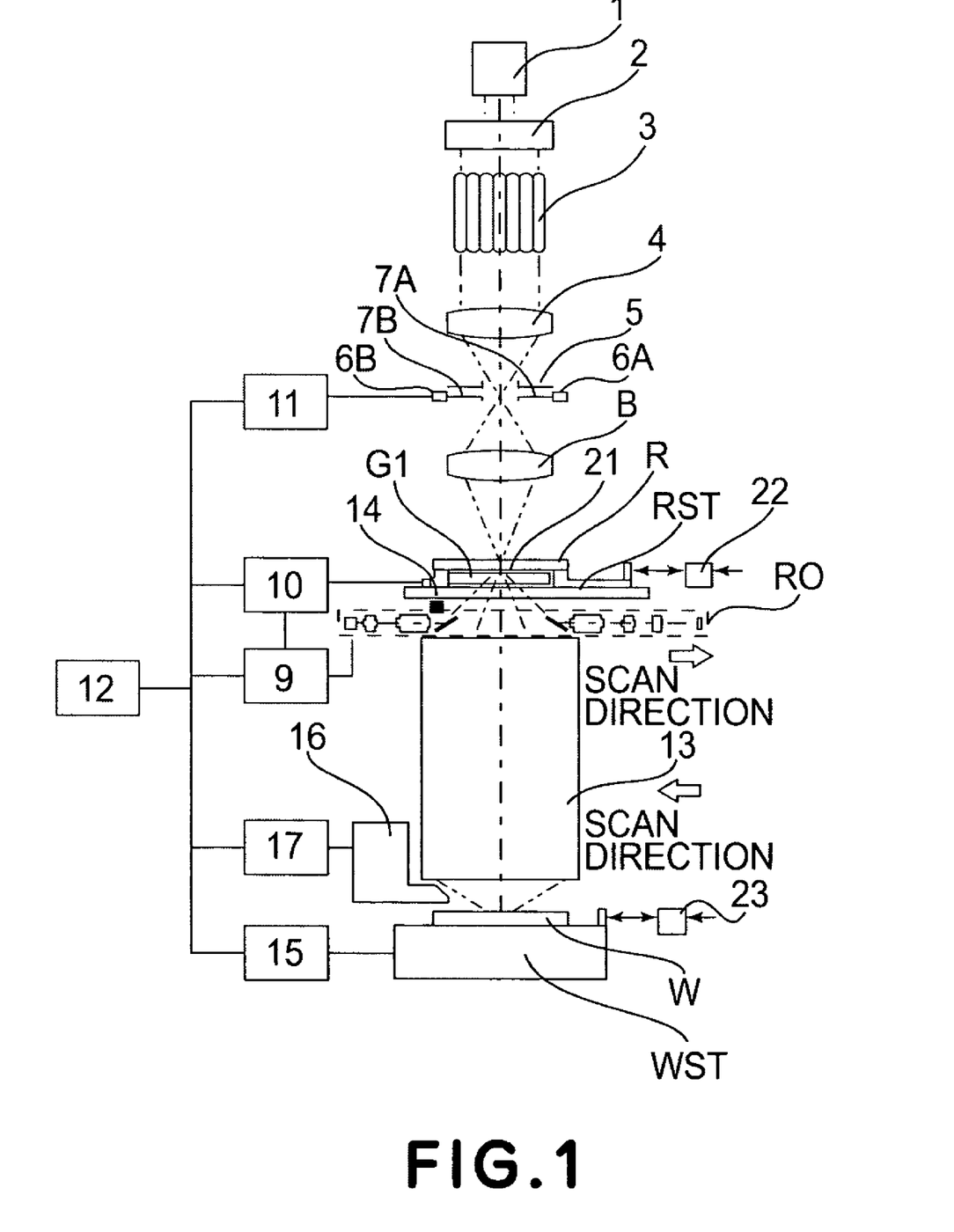
FIG. 1 is a schematic view of an exposure apparatus according to the present invention.

FIG. 1 is a fragmentary and schematic view of a projection exposure apparatus of slit scan type, according to a first embodiment of the present invention, which is based on a scanning exposure method.

A reticle (original) R is uniformly illuminated by a slit-like illumination region 21 of oblong shape as defined by a light source 1 and an illumination optical system which comprises components from an illumination light shaping optical system 2 through a relay lens 8. An image of a circuit pattern of the reticle R inside the slit-like illumination region 21 is then transferred onto a wafer W through a projection optical system 13.

The light source 1 may comprise an excimer laser light source such as F2 excimer laser, ArF excimer laser or KrF excimer laser, for example, a metal vapor laser light source, a pulse light source such as a harmonic wave generator of YAG laser, or a continuous emission type light source having a combination of a Hg lamp and an elliptical reflection mirror, for example. Where a continuous emission light source is used, the on/off control of exposure may be switched by use of a shutter which may be provided in the illumination light shaping optical system (2-8). However, since in the first embodiment there is a movable blind (7A, 7B) for variable field stop means, to be described later, the on/off control of exposure may be switched by the opening/closure of the movable blind (7A, 7B).

The illumination light from the light source 1 is adjusted to a predetermined size by means of the illumination light shaping optical system 2, and then it reaches a fly's eye lens 3. There are a large number of secondary light sources produced at the light exit surface of this fly's eye lens. The illumination light from these secondary light sources is collected by a condenser lens 4 and, after passing through a fixed field stop 5, it reaches the movable blind (7A, 7B). In the first embodiment shown in FIG. 1, the field stop 5 is disposed at the condenser lens 4 side of the movable blind (7A, 7B). However, it may be disposed inversely, that is, at the relay lens 8 side of the movable blind. The field stop 5 is formed with a slit-like opening 5A having an oblong shape, and the light passed through this opening 5A is incident on the relay lens 8. The lengthwise direction of the slit-like opening 5A of oblong shape corresponds to the depth direction (i.e., a direction perpendicular to the sheet of the drawing).

The movable blind (7A, 7B) comprises two movable light blocking blades, that is, movable blinds 7A and 7B, which function to regulate the width in scan direction (Y direction) to be described later, as well as two blades (not shown) for regulating the width in a non-scan direction perpendicular to the scan direction.

The movable blinds 7A and 7B which are light blocking blades for defining the width in the scan direction are supported by driving units 6A and 6B, respectively, for independent motion in the scan direction. Similarly, the two blades (not shown in the drawing) for defining the width in the non-scan direction are supported for independent motion.

In the first embodiment, inside the slit-like illumination region on the reticle R which is defined by the fixed field stop 5, the illumination light is projected yet only within a desired exposure region that is set by the movable blinds at 7A and 7B.

The relay lens system 8 is a bi-telecentric system (telecentric on both sides thereof), and the telecentricity is maintained at the illumination region 21 on the reticle R.

The reticle R is held on a reticle stage RST. The reticle stage RST is arranged to detect the position by use of an interferometer 22, and it is driven by a reticle stage driving unit 10. There is an optical element G1 held below the reticle R, and it is scanned together with the reticle R during the scanning drive of the reticle stage RST. An image of a circuit pattern of the reticle R inside the slit-like illumination region 21 and yet regulated by the movable blinds at 7A and 7B is transferred, by projection exposure, onto the wafer W through the projection optical system 13.

Here, within a two-dimensional plane perpendicular to the optical axis of the projection optical system 13, the scan direction of the reticle R with respect to the slit-like illumination region 21 is taken as +Y direction (or −Y direction), and a direction parallel to the optical axis of the projection optical system 13 is taken as Z direction.

In that case, the reticle stage RST is driven by the reticle stage driving unit 10 to scanningly move the reticle R in the scan direction (+Y direction or −Y direction). The operation of the driving units 6A and 6B for the movable blind blades 7A and 7B as well as the operation of driving units provided for the non-scan direction are controlled by a movable blind control unit 11. The operation of the reticle stage driving unit 10 and the operation of the movable blind control unit 11 are controlled by means of a main control unit 12 which is provided to control the operation of the exposure apparatus as a whole.

Disposed between the optical element G1 held on the reticle stage RST and the projection optical system 13 is a reticle pattern surface measuring system RO (which hereinafter will be simply referred to also as "measuring means").

On the other hand, a wafer W is loaded onto a wafer stage WST by means of a wafer conveying system (not shown) and, after that, it is held thereon. The wafer stage WST includes an X-Y stage configured to position the wafer W with respect to a plane perpendicular to the optical axis of the projection optical system 13 an also to scanningly move the wafer W in ±Y directions, as well as a Z stage for positioning the wafer W with respect to the Z direction. The position of the wafer stage WST is detectable by means of an interferometer 23.

Disposed above the wafer W is an off-axis type alignment sensor 16. By means of this alignment sensor 16, alignment marks on the wafer W are detected. The detection result is processed by a control unit 17 and then supplied to the main control unit 12. The main control unit 12 controls the positioning operation and scanning operation of the wafer stage WST, through a wafer stage driving unit 15.

An image of a pattern formed on the reticle R is transferred onto a plurality of shot regions defined on the wafer W in accordance with a scan exposure method and through the projection optical system 13. To this end, the reticle R is scanningly moved relative to the slit-like illumination region 21 defined by the field stop 5, in the −Y direction (or +Y direction) and at a speed VR. In addition to this, while taking the magnification of the projection optical system 13 as β, the wafer W is also scanningly moved in synchronism with the scan of the reticle R, in the +Y direction (or −Y direction) and at a speed VW (=β·VR). With this procedure, circuit pattern images of the reticle R are sequentially transferred onto the shot regions of the wafer W.

Next, referring to FIG. 2, the reticle pattern surface measuring system RO will be explained in detail.

First of all, the fundamental principle of detection in the reticle pattern surface measuring system RO will be explained. A light flux is projected onto a pattern surface R1 of a reticle R (which is the surface to be examined) in an oblique direction thereto. A light flux reflected by the surface to be examined is incident on a predetermined plane, and the incidence position is then detected by use of a position detecting device. From the thus obtained positional information, positional information regarding the surface being examined, with respect to the Z direction (i.e., the optical axis direction of the projection optical system 13), is detected.

Figure 2:
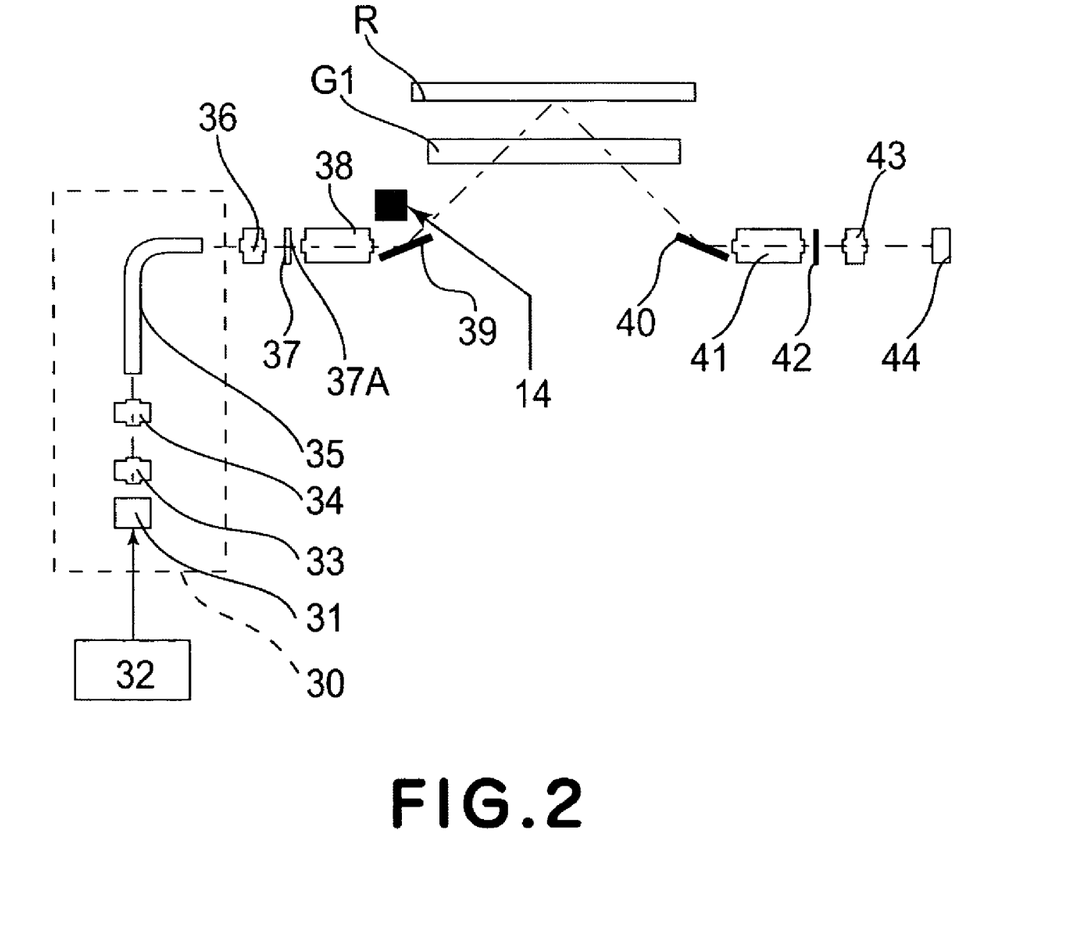
FIG. 2 is a schematic view of a general structure of reticle pattern surface measuring system.

Although only one system is illustrated in FIG. 2, actually a plurality of light fluxes arrayed in a direction approximately orthogonal to the scan direction are projected onto plural measurement points on the surface to be examined, and tilt information regarding the surface to be examined is calculated from different pieces of Z-direction positional information obtained in relation to these measurement points.

Furthermore, since the reticle R is scanningly moved, also with respect to the scan direction the Z-direction positional information is obtainable from plural measurement points. For the measurement, in order that the same measurement point on the reticle R is assuredly measured regardless of the scan speed of the reticle stage RST, synchronous control is carried out between the reticle stage control unit 10 and the reticle pattern measurement control unit 9 of FIG. 1. From the positional information obtained with the procedure described above, the surface shape of the pattern surface of the reticle R can be detected by calculation.

Next, structural components of the reticle pattern surface measuring system RO shown in FIG. 2 will be explained.

The reticle pattern surface measuring system RO itself is fixed onto a base table, not shown. The reticle pattern surface measuring system RO has a light source unit 30 which comprises a light emission source 31, for example. The light emission source 31 is a light source for emitting light to be used for detection of the reticle surface position. It comprises an LED capable of producing light of visible to infrared rays, in order to assure that a sufficient quantity of reflection light is obtainable from the reticle material and with oblique incidence of light. There is a driving circuit 32 which is configured to control the intensity of light to be emitted from the light emission source 31 as desired.

The light emitted from the light emission source 31 is directed to light transmitting means 35 which may comprise an optical fiber, for example, by way of a collimator lens 33 and a condenser lens 34. The light flux emerging from the light transmitting means 35 enters an illumination lens 36 and it illuminates a slit 37. There is a surface position measuring mark 37A formed on the slit 37 member for measurement of the pattern surface R1 of the reticle R. By means of an imaging lens 38 and by way of a mirror 39, this surface position measuring mark 37A is projected onto the pattern surface R1 of the reticle R, which is the surface to be examined. Thus, by means of the imaging lens 38, the slit 37 and the pattern surface R1 of the reticle R are placed in an optically conjugate relationship.

For simplicity of illustration, only a principal ray is illustrated in FIG. 2. The light flux which is based on a mark image as imaged upon the pattern surface R1 of the reticle R is reflected by this pattern surface R1 of the reticle R and, by way of a mirror 40 and by means of another imaging lens 41, the mark image is re-imaged at a best imaging position 42. The light flux which is based on the mark image as re-imaged upon the re-imaging position 42 is collected by means of an enlarging optical system 43, whereby it is approximately imaged upon a light receiving element 44 provided for position detection. A signal from the light receiving element 44 is measurement-processed in a reticle surface position signal processing system, not shown in the drawing, whereby Z-direction position information as well as any tilt information of the pattern surface R1 of the reticle R, which is the surface being examined, are processed.

FIG. 2 is a sectional view and, hence, only one structural line of optical system is illustrated therein. Actually, however, there is a plurality of structural lines of optical systems. Furthermore, while in FIG. 2 the light incidence plane of the detection light of the reticle pattern surface measuring system RO is taken on a section in that sectional view, this is not a requisition. Disposition of the incidence plane may be changed appropriately.

Next, the manner how to compensate a measurement error due to a temperature change of the reticle pattern surface measuring system RO, including measurement light path, will be explained.

Here, the term "temperature of reticle pattern surface measuring system RO" can be defined, for example, as the temperature of an ambience inside a measurement light path shown in FIG. 2, more specifically, that inside the light path from the imaging lens 38 to the imaging lens 41. Alternatively, it can be defined as the temperature of a predetermined portion of the reticle stage, for example, or the temperature of an ambience in a predetermined region between the reticle stage and the projection lens. In summary, it may be defined as a temperature which is correlated with the temperature of the pattern surface measuring system RO that is variable with the reticle stage drive, illumination light or the like. For measurement of that temperature, a thermometer 14 may preferably be disposed near the deflecting mirror 39 or 40. As regards the temperature measurement point, it may be a single point as illustrated in FIG. 2, or it may comprise plural points.

Figure 3:
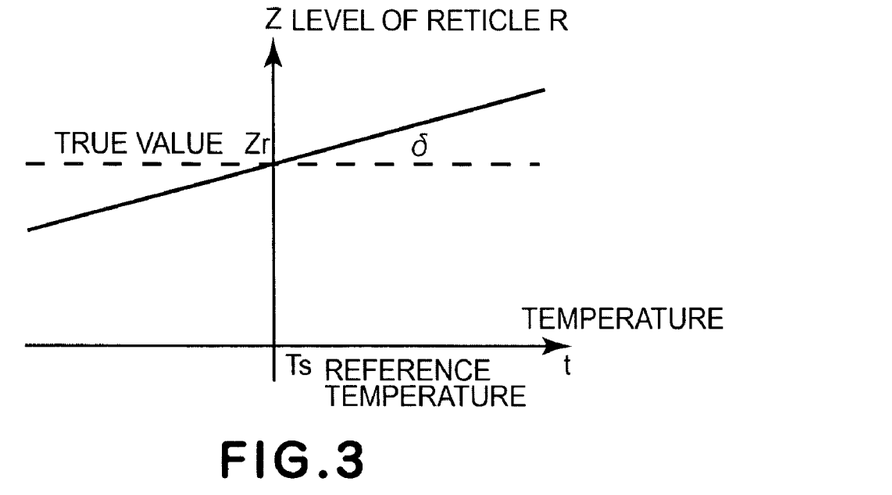
FIG. 3 is a graph for explaining an error in the measured value of a reticle pattern surface measuring system due to a temperature inside a focal point position detecting system which is at a measurement path of the reticle pattern surface measuring system.

There is a relation, as depicted in FIG. 3, between the temperature t of the reticle pattern surface measuring system RO and a quantity Z obtainable by measuring the level (height) of the reticle R by means of the reticle pattern surface measuring system RO, where the temperature by which a true value Zr can be measured is taken as a reference temperature Ts. In other words, if the rate of climb of the measured value of the reticle pattern surface measuring system RO is denoted by $\delta$ (=Z/t), the relationship can be expressed as follows.

$$Z = \delta \cdot (t - Ts) + Zr \quad (1)$$

This means that the larger the temperature difference from the reference temperature Ts is, the larger the measurement error from the true value Zr is. The temperature of the reticle pattern surface measuring system RO is always changeable in accordance with the quantity of illumination light energy, the reticle stage scan speed, the number of successive scan operations, the wafer size, the number of shots thereon, or the wafer replacement time, for example.

The temperature t of the reticle pattern surface measuring system RO may be measured real time or, alternatively, it may be measured at the same timing as the reticle pattern surface measuring system RO measures the pattern surface R1 of the reticle R. As regards the timing of measurement to be made to the pattern surface R1 of the reticle R with the reticle pattern surface measuring system RO, possible examples are: each time as a wafer W is replaced; each time as reticle R is replaced; each time as the reticle stage speed is changed; and real-time measurement during scanning exposure. In any cases, the measured value Z of the reticle pattern surface measuring system RO is compensated for on the basis of the measured temperature t of the reticle pattern surface measuring system RO and in accordance with equation (1) above, and a compensated value Zr is obtainable thereby.

As an example, now a case where the pattern surface R1 of the reticle R should be measured by means of the reticle pattern surface measuring system RO, prior to start of the wafer exposure, will be explained.

Figure 4:
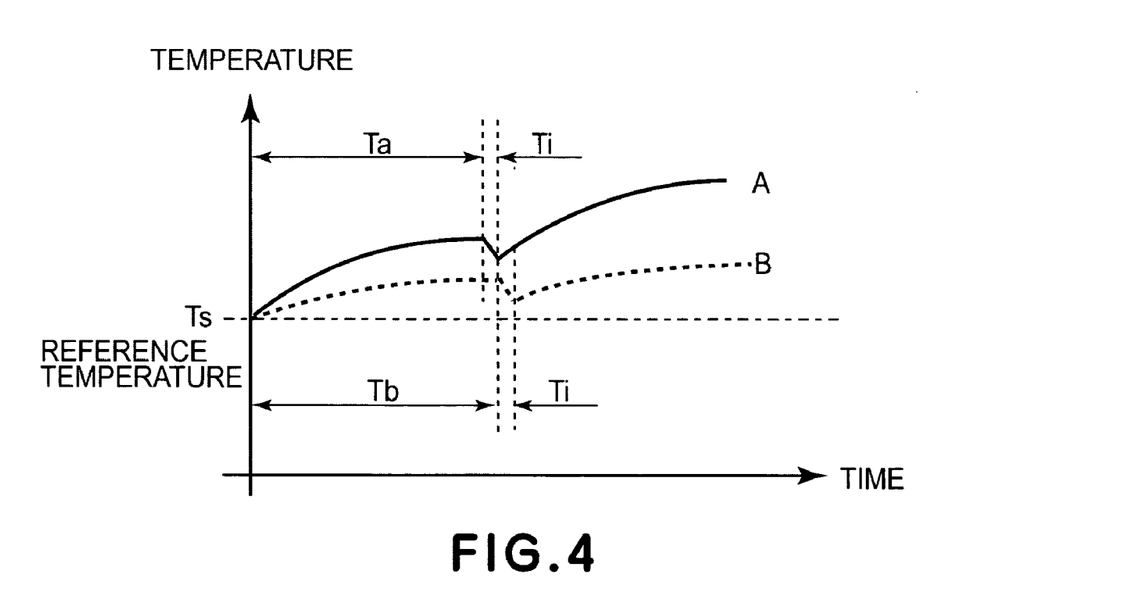
FIG. 4 is a graph for explaining the temperature inside a focal point position detecting system, which is at a measurement path of a reticle pattern surface measuring system, with respect to time.
Figure 5:
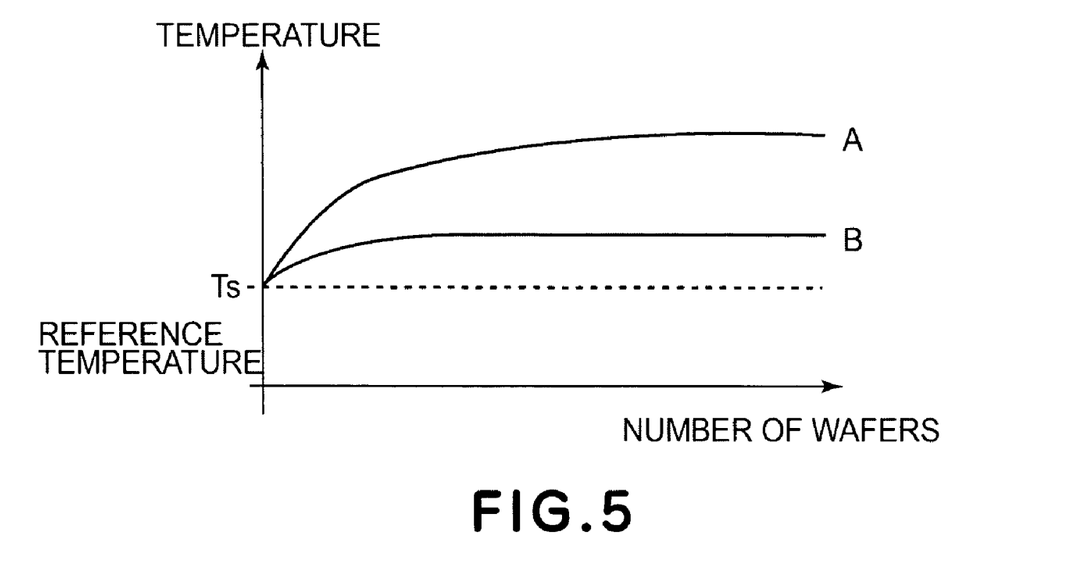
FIG. 5 is graph for explaining the temperature inside a focal point position detecting system, which is at a measurement path of a reticle pattern surface measuring system, with respect to the number of wafers.

FIG. 4 illustrates a model (hereinafter, "temperature rise model") for temperature changes of the reticle pattern surface measuring system RO in relation to two exposure patterns A and B being exposed with a certain illumination light energy.

The curve A corresponds to a case where the scan speed is high. The curve B corresponds to a case where the scan speed is low.

Reference characters Ta and Tb each denotes the time required for exposure of a single wafer. Denoted at Ti is the time until exposure of a subsequent wafer W is initiated (that is, it may correspond to wafer W replacement time, for example), and during the time Ti, the pattern surface R1 of the reticle R is measured by means of the reticle pattern surface measuring system RO.

It is seen from FIG. 4 that the temperature t is different between the moment as the pattern surface R1 of the reticle R is measured with the reticle pattern surface measuring system RO at the reference temperature Ts and the moment as the pattern surface R1 of the reticle R is measured during the time interval Ti. Hence, as shown in FIG. 3, the measured value of the reticle pattern surface measuring system RO contains a measurement error resulting from the temperature change. This means that an incorrect drive compensation value would be set in regard to the Z-axis position of the wafer stage.

In order to avoid this, the time interval Ti may be extended and the pattern surface R1 of the reticle R may be measured after the temperature t is settled down to the reference temperature Ts. However, the throughput would be degraded seriously by the extension of time.

Hence, in this embodiment, stabilization of the temperature t to the reference temperature Ts is not waited for but, rather, the measured value of the reticle pattern surface measuring system RO is compensated for in accordance with equation (1) above and by use of a measured value for the temperature t of the reticle pattern surface measuring system RO at the moment as the reticle pattern surface measuring system RO measures the pattern surface R1 of the reticle R.

It should be noted here that the value concerning the rate-of-change δ of the measured value to be used for the compensation of the output value of the reticle pattern surface measuring system RO may be stored into a memory (storing means) or the like provided in the reticle pattern surface measurement control unit 9. Furthermore, the compensation calculation for the measured value may be carried out by means of the reticle pattern surface measurement control unit, for example.

Embodiment 2

As has been described with reference to the first embodiment, in every exposure apparatus a high-speed thermometer for measuring the temperature of a reticle pattern surface measuring system RO may be provided so as to perform real time temperature measurement and to carry out compensation for the measured value of the reticle pattern surface measuring system RO successively. However, using a high-speed thermometer in every exposure apparatus obviously leads to an increased cost.

In consideration of this, it is a possible alternative that: at the adjustment stage of apparatus, one or more high-speed thermometer for measuring the temperature of a reticle pattern surface measuring system RO are prepared beforehand; any temperature changes in the reticle patterns surface measuring system RO following successive scanning exposure operations are monitored under different exposure conditions, and a temperature rise model is prepared on the basis of it; after the temperature model is accomplished, the high-speed thermometers used at the adjustment stage are demounted.

The different exposure conditions mentioned above may be determined in accordance with parameters such as the quantity of illumination light energy, the wafer size, the number of shots thereon, the reticle stage scan speed, the number of reticle stage scans, and the wafer W replacement time, for example, and in addition, they may be specified by the hysteresis of exposure operations based on these parameters. As regards the preparation of a temperature rise model, as shown in FIG. 4 a real time temperature rise model during the wafer exposure may be prepared. On the other hand, if the pattern surface R1 of the reticle R should be measured with the reticle pattern surface measuring system RO before start of the wafer exposure, the temperature rise model may be prepared and stored per the unit of wafer numbers (i.e., at the measurement timing as, for each wafer, the pattern surface R1 of the reticle R is measured once with use of the reticle pattern surface measuring system RO).

As described above, by preparing and storing a temperature rise model with respect to each of expectable exposure patterns (exposure conditions), at the time of actual exposure a corresponding model can be used to determine (estimate) the temperature t of the reticle pattern surface measuring system RO, such that the measured value of the reticle pattern surface measuring system RO can be compensated correctly in accordance with equation (1).

It should be noted here that these models may be stored into a memory (storing means) or the like provided in the reticle pattern surface measurement control unit 9, and that the compensation calculation for the measured value may be carried out by means of the reticle pattern surface measurement control unit 9, for example.

Each temperature rise model may be determined in accordance with simulations. As an example, a real time simulation model will now be explained.

Figure 6:
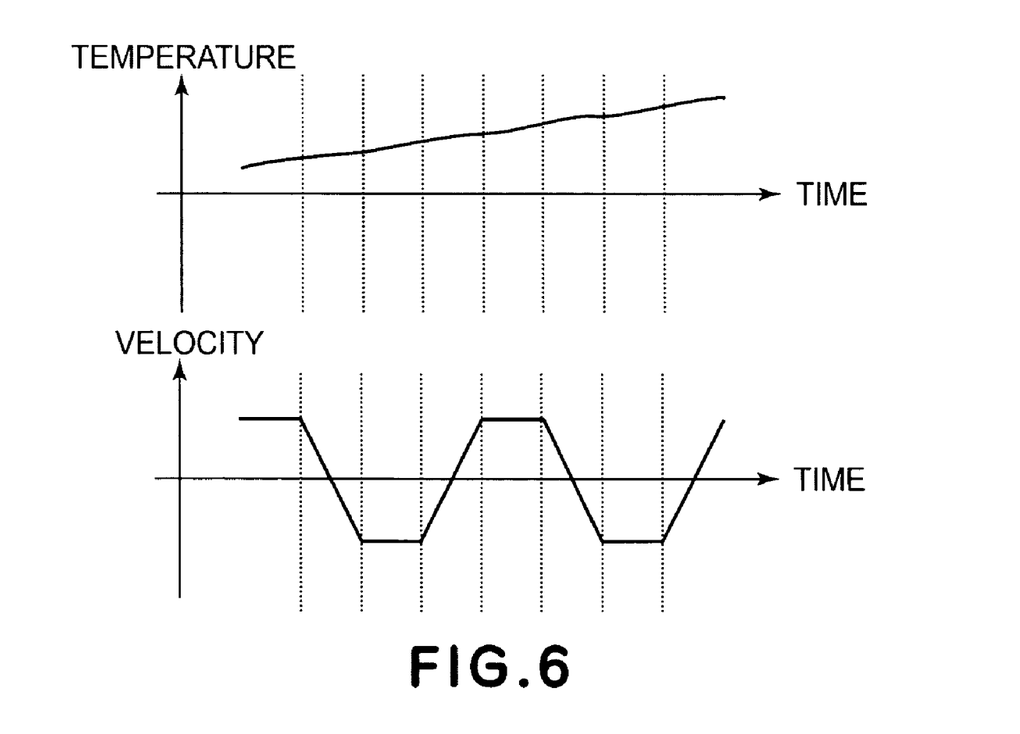
FIG. 6 is a graph for explaining a reticle stage scan speed and changes in the temperature inside a focal point position detecting system, which is at a measurement path of a reticle pattern surface measuring system.
Figure 7:
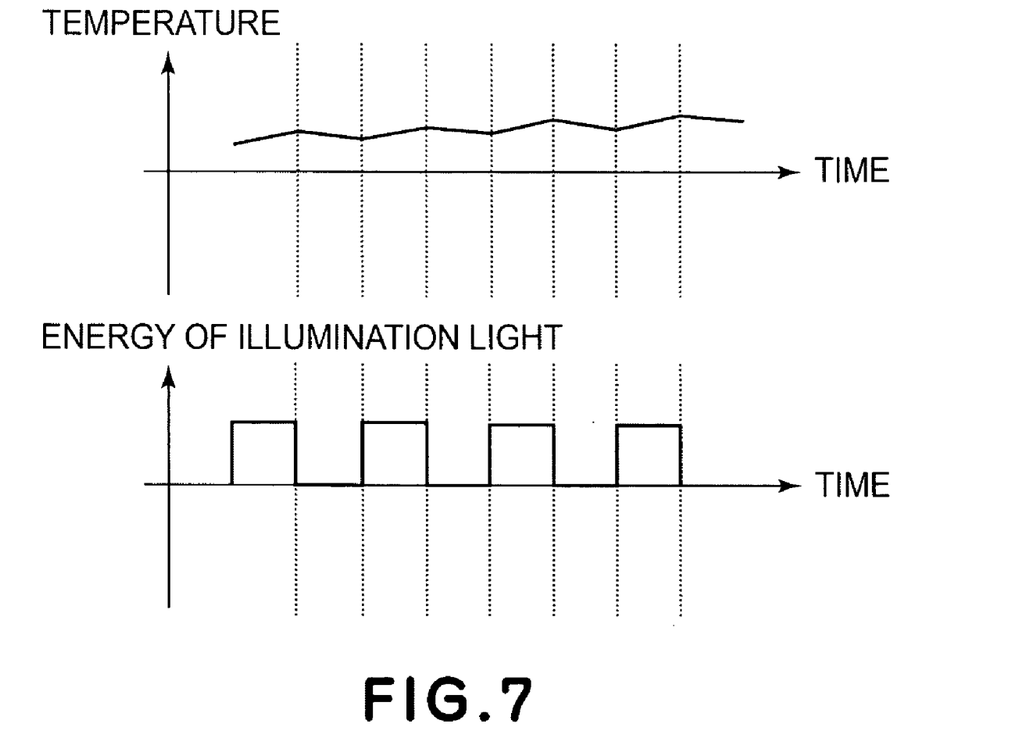
FIG. 7 is a graph for explaining an illumination light energy and changes in the temperature inside a focal point position detecting system, which is at a measurement path of a reticle pattern surface measuring system.

FIG. 6 shows the relationship between the reticle stage scan speed and the temperature change in the reticle pattern surface measuring system RO. FIG. 7 shows the relationship between the illumination light energy and the temperature change in the reticle pattern surface measuring system RO.

Figure 8:
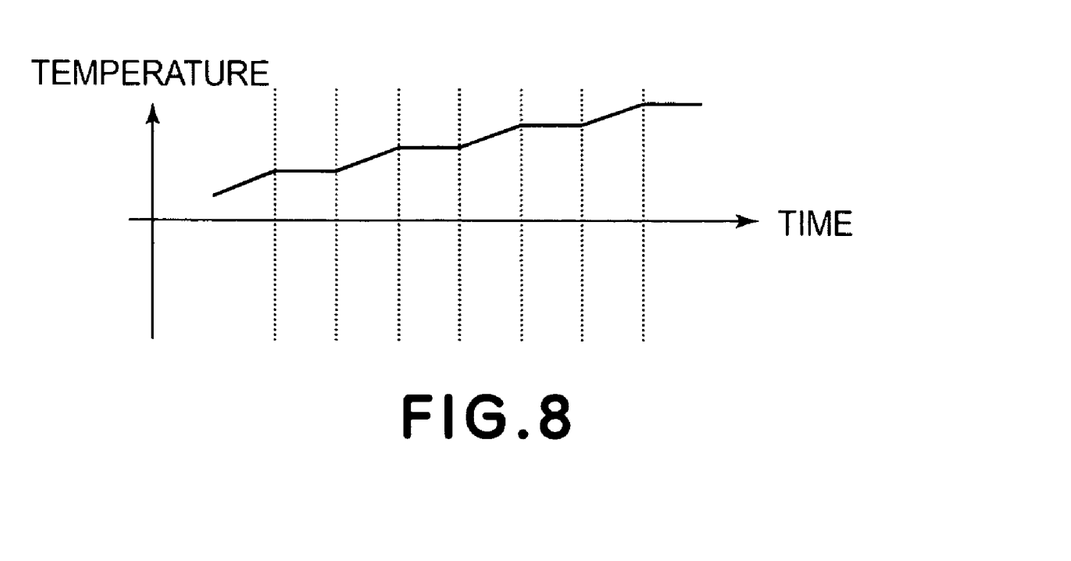
FIG. 8 is a graph for explaining changes in the temperature inside a focal point position detecting system, which is at a measurement path of a reticle pattern surface measuring system, due to a reticle stage scan speed and an illumination light energy.

Hence, as seen in these drawings, with respect to each of different exposure conditions, the temperature change of the reticle pattern surface measuring system RO due to the influence of the reticle stage scan speed as well as the temperature change of the reticle pattern surface measuring system RO due to the influence of the illumination light energy may be stored separately; and on the basis of the relationships such as shown in FIGS. 6 and 7, the temperature change of the reticle surface measuring system RO during the scan exposure may be calculated such as illustrated in FIG. 8.

In the simulation, as a matter of course, the possibility of saturation of temperature rise during long-period reticle stage scanning motion or illumination may be taken in to account. Furthermore, temperature slowdown models of the reticle pattern surface measuring system may be prepared and memorized. This is particularly effective when the exposure operation is discontinued. A term "temperature change model" is used to generally refer to such "temperature rise model" and "temperature slowdown model".

Embodiment 3

Figure 9:
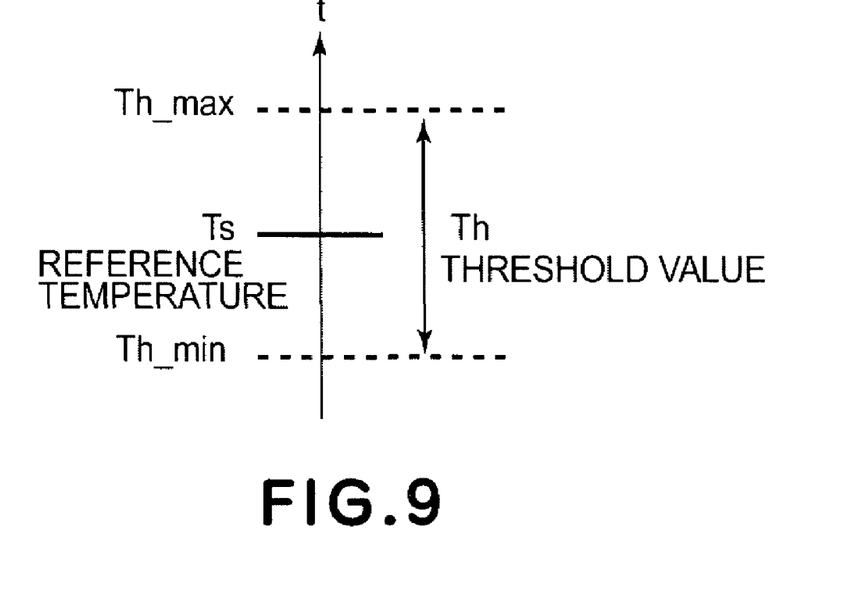
FIG. 9 is a graph for explaining an example wherein an arbitrary threshold value is set for the temperature inside a focal point position detecting system, which is at a measurement path of a reticle pattern surface measuring system.

As regards a method of compensating the measured value of the reticle pattern surface measuring system RO, as shown in FIG. 9, a threshold value Th may be set in regard to the amount of temperature change of the reticle pattern surface measuring system RO. Taking the upper limit of the threshold Th as "Th_max" and taking the lower limit of the same as "Th_min", the compensation mode can be changed in accordance with the temperature zone.

More specifically, if the temperature Tm of the reticle pattern surface measuring system RO where the pattern surface R1 of the reticle R is going to be measured with the reticle pattern surface measuring system RO satisfies the following relation:

$$Tm<Th\_min \text{ or, alternatively, } Tm>Th\_max \quad (2)$$

then the following equation (3) similar to equation (1) may be used for the calculation.

$$Z=\delta(Tm-Ts)+Zr \quad (3)$$

On the other hand, a case where the temperature change of the reticle pattern surface measuring system RO is small as can be expressed by the following relation will be explained.

$$Th\_min \leq Tm \leq Th\_max \quad (4)$$

Figure 10:
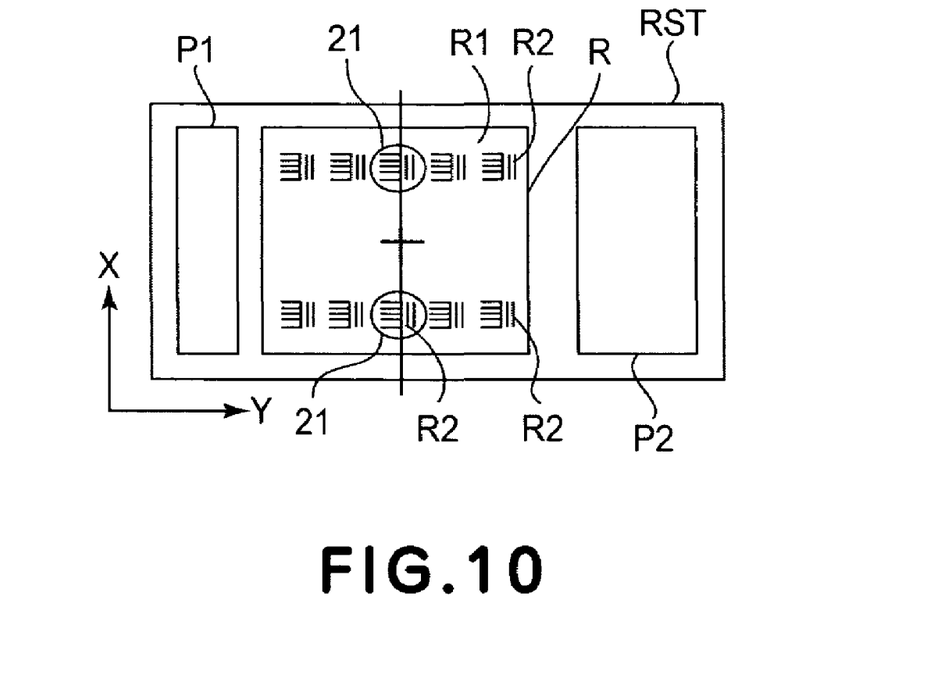
FIG. 10 is a plan view of a reticle stage.

FIG. 10 shows the reticle stage RST as the same is seen from a vertical direction. Denoted at P1 and P2 are flat reference plates. These two reference plates are used for calibration of the motion of the reticle stage RST, or for calibration of an optical autofocus measuring system provided to precisely measure the interspace between the best focus position of the projection optical system 13 and the wafer W surface. There is a circuit pattern R2 formed on the pattern surface R1 (at the bottom surface) of the reticle R. An image of the circuit pattern R2 inside an illumination region 21 is going to be projected onto the wafer W.

First of all, at th reference temperature Ts in the case using equation (1), a measured value Zpts concerning an arbitrary position of the reference plate P1 or P2 as measured by the reticle pattern surface measuring system RO is memorized. Then, each time as the pattern surface R1 (bottom surface) of the reticle R is measured with the reticle pattern surface measuring system RO, the height Zp of the referenced plate is measured, and any difference with Zpts is retained. If the measured value of the pattern surface R1 which is the bottom face of the reticle R is Zm, a compensation value Zr for the measured value can be given by equation (5) below.

$$Zr=Zm+(Zpts-Zp) \quad (5)$$

In the manner expressed by equation (5) above, a measured value of the reticle pattern surface measuring system RO can be compensated. It should be noted here that the reference plate P1 or P2 should preferably be kept approximately at the same height as the reticle R. However, this is not always a requisition.

Furthermore, use of a threshold value such as in equation (2) or (4) may be omitted and, instead, the structure may be modified so that equation (3) or (5) can be chosen appropriately.

In accordance with the embodiments of the present invention having been described hereinbefore, a change in measured value (measurement error) of the reticle pattern surface measuring system RO which change depends on a temperature change of the reticle pattern surface measuring system due to the influence of heat generation in a linear motor or the like for driving a reticle stage or to the influence of the energy of illumination light, for example, can be compensated for very precisely.

Embodiment of Device Manufacturing Method

Next, an embodiment of a device manufacturing method which uses an exposure apparatus described above, will be explained.

Figure 11:
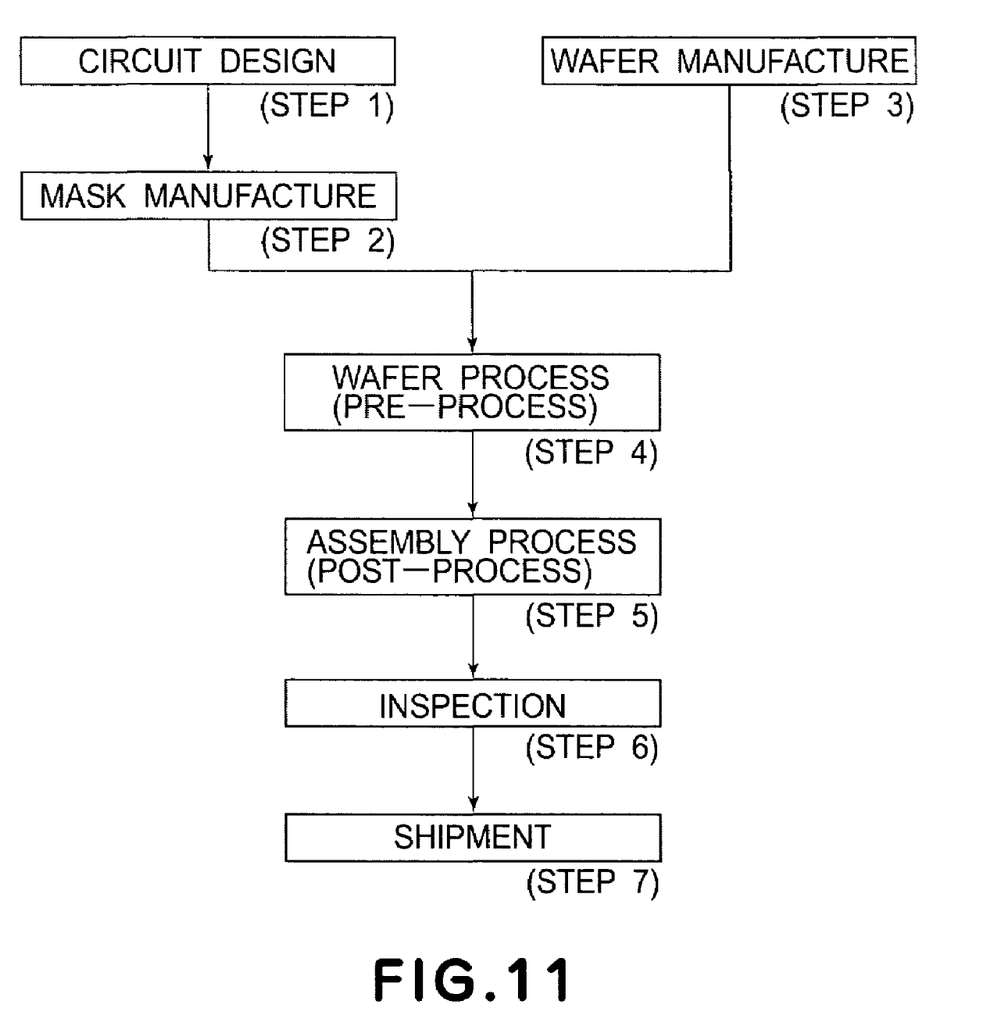
FIG. 11 is a flow chart of semiconductor device manufacturing processes.

FIG. 11 is a flow chart for explaining a general procedure for manufacturing semiconductor devices. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 12:
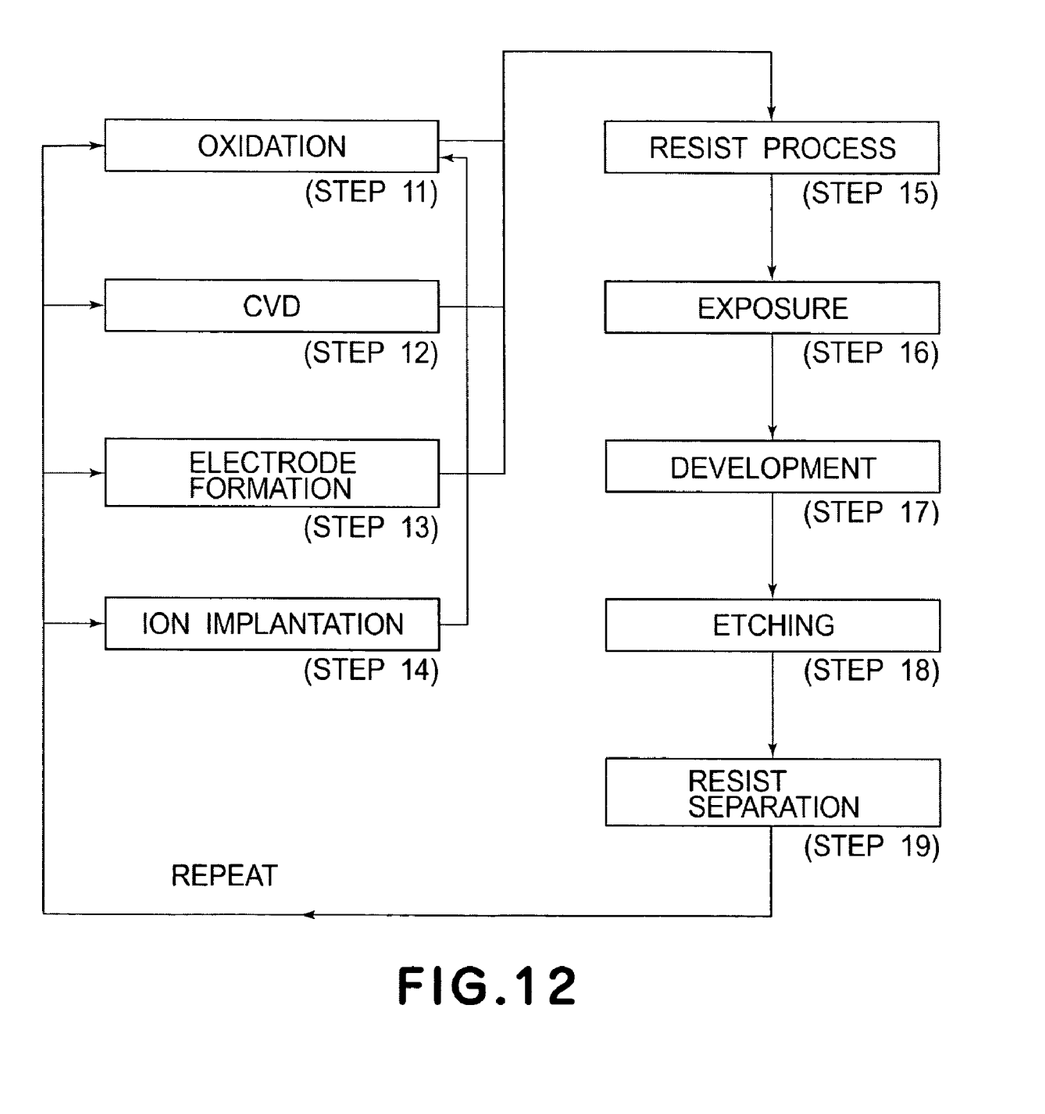
FIG. 12 is a flow chart for explaining details of a wafer process included in the procedure of FIG. 11.

FIG. 12 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the embodiments of the present invention having been described hereinbefore, any measurement error due to a temperature change of the position measuring system can be reduced effectively and significantly.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2005-079498 filed Mar. 18, 2005, for which is hereby incorporated by reference.

What is claimed is:

1. An exposure apparatus, comprising:
    a projection optical system;
    an original stage configured to hold an original thereon and to move the original;
    a position measuring system configured to measure a local position of a pattern surface of the original held by said original stage, with respect to a direction parallel to an optical axis of exposure light directed by said projection optical system, so that a substrate can be exposed through the original and said projection optical system, on the basis of the measurement by said position measuring system;
    a memory configured to store therein a rate change of an output of said position measuring system to a temperature of said position measuring system; and
    a controller configured to calculate a compensated value based on a measured or estimated temperature of said position measuring system, an output of said position measuring system and the rate of change stored in said memory.

2. An apparatus according to claim 1, further comprising a temperature sensor configured to measure the temperature of said position measuring system.

3. An apparatus according to claim 1, wherein said controller is configured to estimate the temperature of said position measuring system on the basis of hysteresis information regarding an exposure operation of said exposure apparatus.

4. An apparatus according to claim 3, wherein the hysteresis information contains at least one of a driving hysteresis of said original stage and an illumination hysteresis related to the original.

5. A device manufacturing method, comprising steps of:
exposing a substrate to light through a reticle, by use of the exposure apparatus as recited in claim 1;
developing the exposed substrate; and
processing the developed substrate to produce a device.

6. An exposure method for exposing a substrate through an original and a projection optical system, said method comprising steps of:

measuring by use of a position measuring system a local position of a pattern surface of the original, as held by an original stage configured to hold and to move the original, with respect to a direction parallel to an optical axis of exposure light directed by the projection optical system;

calculating a compensated value based on a measured or estimated temperature of the position measuring system, an output of the position measuring system and the rate of change of an output of the position measuring system to a temperature of the position measuring system; and exposing the substrate through the original and the projection optical system, on the basis of the calculated compensated value.

* * * * *